United States Patent
Shieh

(10) Patent No.: US 10,059,803 B2
(45) Date of Patent: Aug. 28, 2018

(54) RESIN CONTAINING OXETANE AND EPOXY GROUPS AND RESIN COMPOSITION INCLUDING THE SAME

(71) Applicant: INDUSTRIAL TECHNOLOGY RESEARCH INSTITUTE, Hsinchu (TW)

(72) Inventor: Tien-Shou Shieh, Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 591 days.

(21) Appl. No.: 14/602,889

(22) Filed: Jan. 22, 2015

(65) Prior Publication Data
US 2016/0145387 A1 May 26, 2016

(30) Foreign Application Priority Data
Nov. 24, 2014 (TW) .............................. 103140592 A

(51) Int. Cl.
| C08G 67/04 | (2006.01) |
| C08G 65/22 | (2006.01) |
| C08G 59/14 | (2006.01) |
| C08G 65/18 | (2006.01) |
| H01L 51/52 | (2006.01) |

(52) U.S. Cl.
CPC ......... *C08G 67/04* (2013.01); *C08G 59/1438* (2013.01); *C08G 65/18* (2013.01); *C08G 65/22* (2013.01); *H01L 51/5253* (2013.01)

(58) Field of Classification Search
None
See application file for complete search history.

(56) References Cited

U.S. PATENT DOCUMENTS

| 3,280,153 | A | 10/1966 | Stark |
| 5,463,084 | A | 10/1995 | Crivello et al. |
| 5,674,922 | A | 10/1997 | Igarashi et al. |
| 5,721,020 | A | 2/1998 | Takami et al. |
| 6,015,914 | A | 1/2000 | Sasaki et al. |
| 6,096,903 | A | 8/2000 | Moszner et al. |
| 6,121,342 | A | 9/2000 | Suzuki et al. |
| 6,469,108 | B2 | 10/2002 | Kuriyama et al. |
| 6,495,636 | B2 | 12/2002 | Sugiyama et al. |
| 6,586,496 | B1 | 7/2003 | Takamatsu et al. |
| 6,753,454 | B1 | 6/2004 | Smith et al. |
| 6,780,898 | B2 | 8/2004 | Kumakura |
| 6,783,840 | B2 | 8/2004 | Watanabe et al. |
| 6,835,950 | B2 | 12/2004 | Brown et al. |
| 7,169,446 | B2 | 1/2007 | Nishizeki et al. |
| 7,202,286 | B2 | 4/2007 | Hatton |
| 7,230,055 | B2 | 6/2007 | Musa |
| 7,235,593 | B2 | 6/2007 | Crivello |
| 7,265,231 | B2 | 9/2007 | Levorse, Jr. et al. |
| 7,414,103 | B2 | 8/2008 | Musa |
| 7,495,035 | B2 | 2/2009 | Yamamoto et al. |
| 7,576,142 | B2 | 8/2009 | Tauchi et al. |
| 7,671,114 | B2 | 3/2010 | Woods et al. |
| 7,756,503 | B2 | 7/2010 | Tamaki et al. |
| 7,763,182 | B2 | 7/2010 | Seki et al. |
| 7,887,716 | B2 | 2/2011 | Kong et al. |
| 7,902,305 | B2 | 3/2011 | Kong |
| 7,923,481 | B2 | 4/2011 | Gaudl et al. |
| 7,985,866 | B2 | 7/2011 | Iwahama et al. |
| 8,008,429 | B2 | 8/2011 | Katayama et al. |
| 8,017,795 | B2 | 9/2011 | Webster et al. |
| 8,110,613 | B2 | 2/2012 | Oike et al. |
| 8,273,843 | B2 | 9/2012 | Tajima et al. |
| 8,277,968 | B2 | 10/2012 | Ichikawa et al. |
| 8,329,774 | B2 | 12/2012 | Ooike et al. |
| 8,377,623 | B2 | 2/2013 | Fong |
| 8,530,539 | B2 | 9/2013 | Miyake et al. |
| 8,604,102 | B2 | 12/2013 | Shieh et al. |

(Continued)

FOREIGN PATENT DOCUMENTS

| CN | 1397588 A | 2/2003 |
| CN | 1646593 A | 7/2005 |

(Continued)

OTHER PUBLICATIONS

Chinese Office Action and Search Report, dated Aug. 2, 2017, for Chinese Application No. 201510019349.4.
Kudo et al., "Synthesis of Polyesters with Pendant Oxetane Groups by the Chemoselective Alternating Copolymerization of 3-Ethyl-3-(glycidyloxymethyl)oxetane with Carboxylic Anhydride and Its Photochemical Reaction", Journal of Polymer Science: Part A: Polymer Chemistry, vol. 41, 2003, pp. 1952-1961.
Motoi et al., "Oxetane Derivatives and Their Polymers for Designing Functional Polymers Containing a Soft, Somewhat Polar Polyether Network as a Polymer Support", Bulletin of The Chemical Society of Japan, vol. 62, No. 5, 1989, pp. 1572-1581.
Nishikubo et al., "Novel Thermal Curing Reaction of Oxetane Resins with Polyfunctional Phenols", Journal of Polymer Science: Part A: Polymer Chemistry, vol. 43, 2005. pp. 2028-2037.

*Primary Examiner* — Randy P Gulakowski
*Assistant Examiner* — Ha S Nguyen
(74) *Attorney, Agent, or Firm* — Birch, Stewart, Kolasch & Birch, LLP

(57) ABSTRACT

A resin containing oxetane and epoxy groups is provided, being formed by reacting (a) a product of reacting 1 part by mole of a mono-oxetane with a hydroxyl group and 1.1 to 2.5 parts by mole of anhydride, and (b) 2.1 to 4.2 parts by mole of a diepoxy compound. The mono-oxetane with a hydroxyl group has a structure:

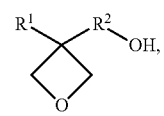

wherein $R^1$ is H, $C_{1-6}$ alkyl group, $C_{1-6}$ fluoroalkyl group, alkenyl group, or phenyl group, and $R^2$ is $C_{1-6}$ alkylene group or vinyl ether group.

11 Claims, No Drawings

(56) References Cited

U.S. PATENT DOCUMENTS

| | | | |
|---|---|---|---|
| 8,704,348 | B2 | 4/2014 | Webster et al. |
| 2003/0062125 | A1 | 4/2003 | Takamatsu et al. |
| 2005/0061429 | A1 | 3/2005 | Hosaka |
| 2007/0027231 | A1 | 2/2007 | Goto et al. |
| 2008/0293875 | A1 | 11/2008 | Hatanaka |
| 2009/0239175 | A1 | 9/2009 | Steinmann |
| 2012/0196948 | A1 | 8/2012 | Webster et al. |
| 2012/0289108 | A1 | 11/2012 | Kim et al. |
| 2013/0177719 | A1 | 7/2013 | Tasaka et al. |
| 2013/0320264 | A1 | 12/2013 | Yoshida et al. |

FOREIGN PATENT DOCUMENTS

| | | |
|---|---|---|
| CN | 1784450 A | 6/2006 |
| CN | 101155853 A | 4/2008 |
| CN | 101243117 A | 8/2008 |
| CN | 101263177 A | 9/2008 |
| CN | 101770171 A | 7/2010 |
| CN | 101970539 A | 2/2011 |
| CN | 102471560 A | 5/2012 |
| CN | 102775397 A | 11/2012 |
| CN | 103025839 A | 4/2013 |
| JP | 2002-249578 A | 9/2002 |
| JP | 2003-201286 A | 7/2003 |
| JP | 2003-277480 A | 10/2003 |
| JP | 2005-139335 A | 6/2005 |
| JP | 2005-154659 A | 6/2005 |
| JP | 2005-171119 A | 6/2005 |
| JP | 2007-112956 A | 5/2007 |
| JP | 2007-211200 A | 8/2007 |
| JP | 2013116986 A * | 6/2013 |
| JP | 2013-231163 A | 11/2013 |
| JP | 2014-019800 A | 2/2014 |
| TW | I245583 B | 12/2005 |
| TW | I374910 B | 10/2012 |
| WO | WO 2011/001912 A1 | 1/2011 |
| WO | WO 2013/049154 A2 | 4/2013 |
| WO | WO 2014/013716 A1 | 1/2014 |

OTHER PUBLICATIONS

Yang et al., "Photocurable Transparent Cycloaliphatic Epoxy Hybrid Materials Crosslinked by Oxetane", Journal of Applied Polymer Science, vol. 126, 2013, E380-E386.

Zhan et al., "Synthesis and properties of cationic photopolymerizable hyperbranched polyesters with terminal oxetane groups by the couple-monomer polymerization of carboxylic anhydride with hydroxyl oxetane", Polymer 51, vol. 62, No. 5, 2010, pp. 3402-3409.

Taiwanese Office Action, dated Sep. 8, 2015, for Taiwanese Application No. 103140592.

* cited by examiner

RESIN CONTAINING OXETANE AND EPOXY GROUPS AND RESIN COMPOSITION INCLUDING THE SAME

CROSS REFERENCE TO RELATED APPLICATIONS

The present application is based on, and claims priority from, Taiwan Application Serial Number 103140592, filed on Nov. 24, 2014, the disclosure of which is hereby incorporated by reference herein in its entirety.

TECHNICAL FIELD

The technical field relates to a resin, and in particular it relates to a resin containing oxetane and epoxy groups.

BACKGROUND

In the manufacture of OLED, the organic material and metal electrode are very sensitive to moisture and oxygen in the environment, thereby reducing the luminance of device, increasing the driving voltage of device, and causing dark spots and short circuits. As such, the packaging process for the OLED is important, and the packaging material and corresponding preparation are major development topics thereof.

SUMMARY

One embodiment of the disclosure provides a resin containing oxetane and epoxy groups, being formed by reacting: (a) a product of reacting 1 part by mole of a mono-oxetane with a hydroxyl group and 1.1 to 2.5 parts by mole of anhydride, and (b) 2.1 to 4.2 parts by mole of a diepoxy compound.

One embodiment of the disclosure provides a resin composition, comprising: 100 parts by weight of the described resin; and 1 to 10 parts by weight of a curing agent.

A detailed description is given in the following embodiments.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details.

The resin containing oxetane and epoxy groups of the disclosure is formed as described below. 1 part by mole of a mono-oxetane with a hydroxyl group and 1.1 to 2.5 parts by mole of anhydride are pre-reacted to form an oxetane intermediate having a carboxyl group as shown in Formula 1.

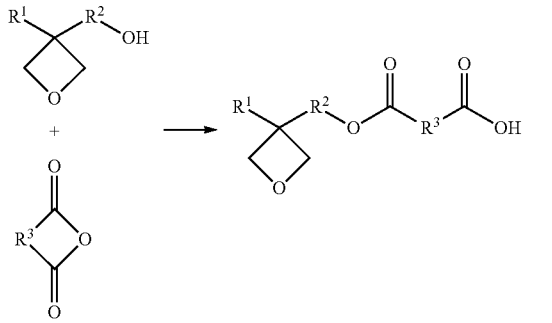

(Formula 1)

In Formula 1, $R^1$ is H, $C_{1-6}$ alkyl group, $C_{1-6}$ fluoroalkyl group, alkenyl group, or phenyl group. $R^2$ is $C_{1-6}$ alkylene group or vinyl ether group. $R^3$ is

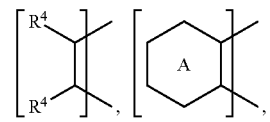

or a combination thereof. Each $R^4$ is independently of H, $C_{1-16}$ alkyl group, or $C_{1-16}$ alkyl group where a —$CH_2$ group is substituted by oxygen, ethylene group, carbonyl group, carboxyl group, cyclohexyl group, or phenyl group.

The

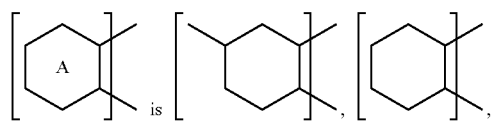

is

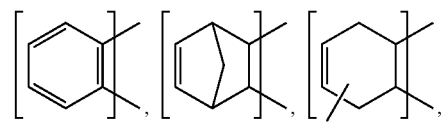

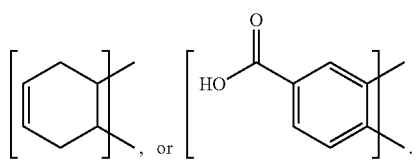

, or

In one embodiment, the pre-reaction in Formula 1 is performed at a temperature of 100° C. to 130° C. A pre-reaction is easily gelled at an overly high temperature. A pre-reaction needs a longer reaction period at an overly low temperature, thereby easily yellowing the resin.

The carboxyl group of the intermediate can be esterified with 2.1 to 4.2 parts by mole of diepoxy compound. The residual anhydride and the residual diepoxy compound are polymerized by another esterification to form a resin containing oxetane and epoxy groups, as shown in Formula 2 or 3. An overly high reaction viscosity of resin cannot be controlled due to an overly low amount of the diepoxycompound. The resin cannot be sufficiently esterified due to an overly high amount of the diepoxy compound.

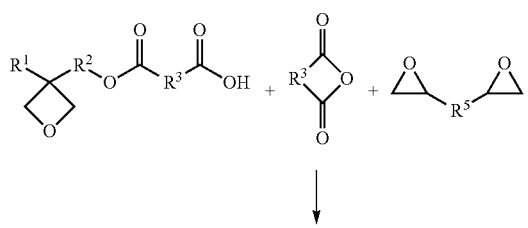

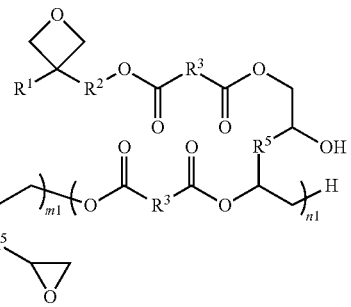

(Formula 2)

In Formula 2, the definitions of $R^1$, $R^2$ and $R^3$ are similar, as described above. $R^5$ is

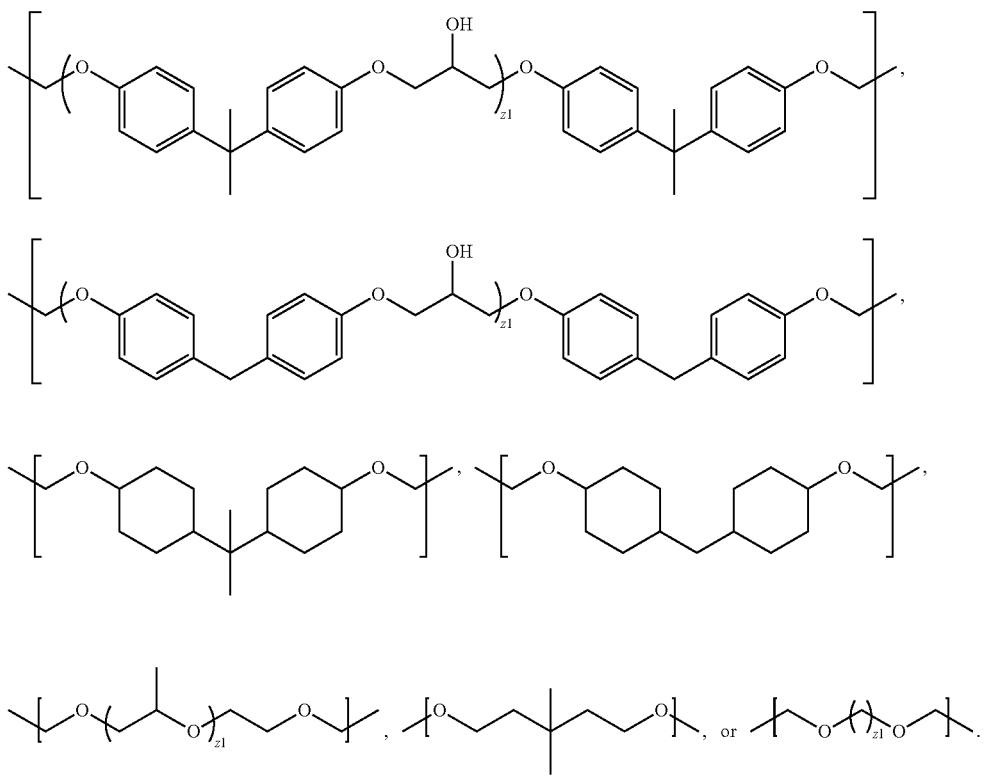

$z1$ is an integer of 0 to 3, $m1$ is a positive integer greater than 1, and $n1$ is a positive integer greater than 1.

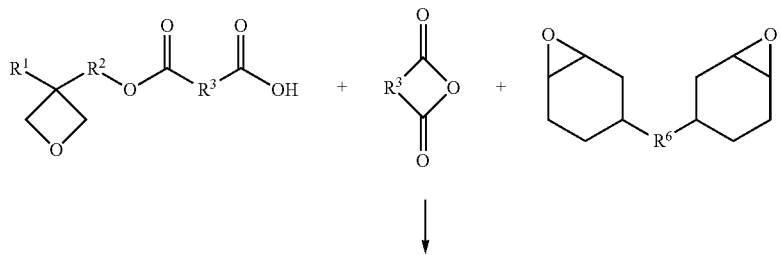

-continued

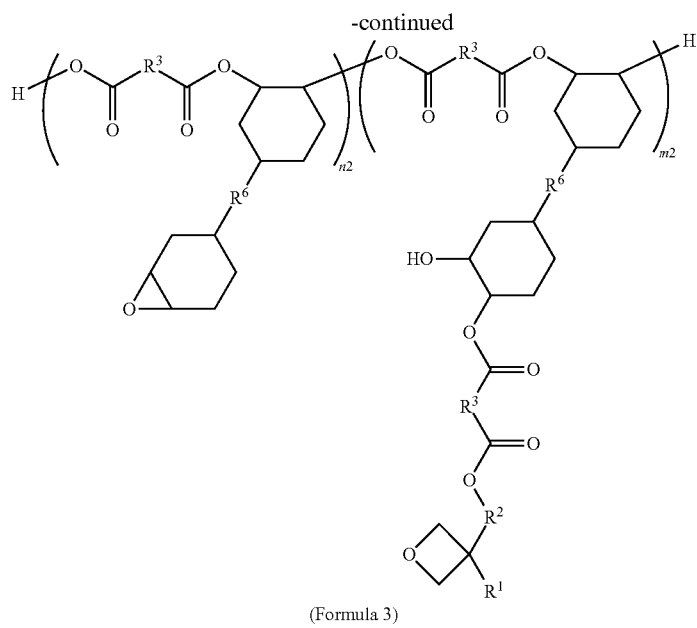

(Formula 3)

In Formula 3, the definitions of $R^1$, $R^2$ and $R^3$ are similar, as described above. $R^6$ is

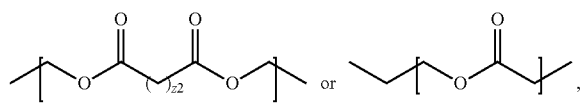

wherein z2 is a positive integer of 1 to 4. m2 is a positive integer greater than 1, and n2 is a positive integer greater than 1. In one embodiment, the mono-oxetane with a hydroxyl group can be 3-(hydroxymethyl)oxetane, 3-ethyl-3-(hydroxymethyl)oxetane, 4-(3-Ethyl-oxetan-3-yl-methoxy)-butan-1-ol, bis[1-hydroxymethyl-(3-oxetanyl)] methyl ether, or a combination thereof. The anhydride can be methylhexahydrophthalic anhydride, hexahydrophthalic anhydride, nadic methyl anhydride, trimellitic anhydride, dodecenyl succinic anhydride, phthalic anhydride, tetrahydrophthalic anhydride, methyl tetrahydrophthalic anhydride, or a combination thereof. The diepoxy compound can be bisphenol A epoxy resin or a derivative thereof, hydrogenated bisphenol A epoxy resin or a derivative thereof, bisphenol F epoxy resin or a derivative thereof, hydrogenated bisphenol F epoxy resin or a derivative thereof, aliphatic epoxy resin, cycloaliphatic epoxy resin, or a combination thereof.

In one embodiment, the reactions in Formulae 2 and 3 are performed at a temperature of 100° C. to 130° C. A reaction is easily gelled at an overly high temperature. A reaction needs a longer reaction period at an overly low temperature, thereby easily yellowing the resin. In one embodiment, the resin containing oxetane and epoxy groups formed by the above reactions has a viscosity at room temperature of about 50 Pa·S to 1,100 Pa·S. A resin with an overly high viscosity at room temperature is too rigid, thereby lowering the adherence between the resin and a flexible substrate. A resin with an overly low viscosity at room temperature has a short molecular chain, thereby making it difficult to form a film of the resin on a flexible substrate.

In one embodiment, the diepoxy compound is super-stoichiometric, such that the terminals of the molecular chain simultaneously have reactivity from epoxy group and oxetane group. Note that the reactions should be sequentially performed. For example, if the mono-oxetane with a hydroxyl group, the anhydride, and the diepoxy compound are directly mixed to react, almost all of the anhydride and the diepoxy compound will react to form a polymer, such that the mono-oxetane with a hydroxyl group cannot react with the anhydride.

In one embodiment, 100 parts by weight of the resin containing oxetane and epoxy groups (e.g. the product in Formula 2, the product in Formula 3, or a combination thereof) can be mixed with 1 to 10 parts by weight of a curing agent to serve as a resin composition. A resin composition with an overly low ratio of the curing agent cannot be efficiently cured by applying energy (such as UV or heat) to the resin. A resin composition with an overly high ratio of the curing agent will have poor properties after being cured due to a molecular chain that is too short. The curing agent can be UV cationic initiator, thermal cationic initiator, or thermal anionic initiator. In one embodiment, the UV cationic initiator includes diaromatic iodide or triaromatic sulfide. In one embodiment, the thermal cationic initiator can be [4-[(methoxycarbonyl)oxy]phenyl]methyl(phenylmethyl)sulfonium, (OC-6-11)-hexafluoroantimonate(1−); (4-hydroxyphenyl)methyl(1-naphthalenylmethyl)sulfonium, (OC-6-11)-hexafluoroantimonate(1−); (4-hydroxyphenyl)methyl[(2-methylphenyl)methyl]sulfonium, (OC-6-11)-hexafluoroantimonate(1−); (4-hydroxyphenyl)methyl (phenylmethyl)sulfonium, (OC-6-11)-hexafluoroantimonate(1−); [4-(acetyloxy)phenyl]dimethylsulfonium, (OC-6-11)-hexafluoroantimonate(1−); (4-hydroxyphenyl)methyl (phenylmethyl)sulfonium, hexafluorophosphate(1−), or a combination thereof. In one embodiment, the thermal anionic initiator includes (4-hydroxyphenyl)methyl(phenylmethyl)sulfonium, tetrakis(2,3,4,5,6-oentafluorophenyl)borate(1−) (1:1); (4-hydroxyphenyl) dimethylsulfonium, tetrakis(2,3,4,5,6-oentafluorophenyl)borate(1−) (1:1); [4-(acetyloxy)phenyl]dimethylsulfonium, tetrakis(2,3,4,5,6-oentafluorophenyl)borate(1−)(1:1), or a combination thereof. The resin composition may serve as a packaging material or a protection film for a flexible substrate. The resin composition has an excellent adherence to the flexible substrate such as polyimide (PI), polyethylene terephthalate (PET), polyethylene naphthalate (PEN), and the like.

In one embodiment, 0.1 to 30 parts by weight of an additive (such as filler, defoamer, leveling agent, or a combination thereof) can be added to the resin composition. In one embodiment, the filler can be silica, talc powder, alumina, clay, or a combination thereof.

Below, exemplary embodiments will be described in detail so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

Preparation of a Resin Containing Oxetane and Epoxy Groups

Example 1-1 (OXA-A1-HY Resin)

10 parts by weight of 3-ethyl-3-hydroxymethyloxetane OXT-101 (abbreviation OXA, commercially available from Toagosei Co., Ltd.) and 16 parts by weight of methylhexahydrophthalic anhydride (abbreviation A1) were mixed at a molar ratio of 1:1.105. 0.05 parts by weight of triethanolamine to serve as a catalyst, was added to the mixture, which was then reacted in an oil bath at 120° C. for 30 minutes. Thereafter, 90 parts by weight of a liquid of epoxidized hydrogenated bisphenol A, EPALLOY™ 5000 (abbreviation HY, commercially available from CVC Thermoset Specialties) was added into the oil bath to be reacted at 120° C. for a further 60 minutes. As such, the OXA-A1-HY resin was obtained. The viscosity at room temperature of the OXA-A1-HY resin was about 180 Pa·s, which was measured by a viscometer (BROOKFIELD DV-III ULTRA).

Example 1-2 (OXA-A2-HY Resin)

10 parts by weight of OXA and 24 parts by weight of methylhexahydrophthalic anhydride (abbreviation A2) were mixed at a molar ratio of 1:1.658. 0.05 parts by weight of triethanolamine to serve as a catalyst, was added to the mixture, which was then reacted in an oil bath at 120° C. for 30 minutes. Thereafter, 90 parts by weight of HY was added into the oil bath to be reacted at 120° C. for a further 60 minutes. As such, the OXA-A2-HY resin was obtained. The viscosity at room temperature of the OXA-A2-HY resin was about 210 Pa·s, which was measured by a viscometer (BROOKFIELD DV-III ULTRA).

Example 1-3 (OXA-A3-HY Resin)

10 parts by weight of OXA and 32 parts by weight of methylhexahydrophthalic anhydride (abbreviation A3) were mixed at a molar ratio of 1:2.210. 0.05 parts by weight of triethanolamine to serve as a catalyst, was added to the mixture, which was then reacted in an oil bath at 120° C. for 30 minutes. Thereafter, 90 parts by weight of HY was added into the oil bath to be reacted at 120° C. for a further 60 minutes. As such, the OXA-A3-HY resin was obtained. The viscosity at room temperature of the OXA-A3-HY resin was about 250 Pa·s, which was measured by a viscometer (BROOKFIELD DV-III ULTRA).

Example 1-4 (OXA-B1-HY Resin)

10 parts by weight of OXA and 16 parts by weight of succinic anhydride (abbreviation B1) were mixed at a molar ratio of 1:1.857. 0.05 parts by weight of triethanolamine to serve as a catalyst, was added to the mixture, which was then reacted in an oil bath at 120° C. for 30 minutes. Thereafter, 90 parts by weight of HY was added into the oil bath to be reacted at 120° C. for a further 60 minutes. As such, the OXA-B1-HY resin was obtained. The viscosity at room temperature of the OXA-B1-HY resin was about 500 Pa·s, which was measured by a viscometer (BROOKFIELD DV-III ULTRA).

Example 1-5 (OXA-A1-EP Partially Esterified Epoxy Resin)

10 parts by weight of OXA and 16 parts by weight of methylhexahydrophthalic anhydride (abbreviation A1) were mixed at a molar ratio of 1:1.105. 0.05 parts by weight of triethanolamine to serve as a catalyst, was added to the mixture, which was then reacted in an oil bath at 120° C. for 30 minutes. Thereafter, 90 parts by weight of a liquid of bisphenol A epoxy resin EPON 828 (abbreviation EP, commercially available from Shell Chemical) was added into the oil bath to be reacted at 120° C. for a further 45 minutes. As such, the OXA-A1-EP resin was obtained. The viscosity at room temperature of the OXA-A1-EP resin was about 800 Pa·s, which was measured by a viscometer (BROOKFIELD DV-III ULTRA).

Example 1-6 (OXA-A2-EP Partially Esterified Epoxy Resin)

10 parts by weight of OXA and 24 parts by weight of methylhexahydrophthalic anhydride (abbreviation A2) were mixed at a molar ratio of 1:1.658. 0.05 parts by weight of triethanolamine to serve as a catalyst, was added to the mixture, which was then reacted in an oil bath at 120° C. for 30 minutes. Thereafter, 90 parts by weight of EP was added into the oil bath to be reacted at 120° C. for a further 45 minutes. As such, the OXA-A2-EP resin was obtained. The viscosity at room temperature of the OXA-A2-EP resin was about 1100 Pa·s, which was measured by a viscometer (BROOKFIELD DV-III ULTRA).

Example 1-7 (OXA-A1-CE Resin)

10 parts by weight of OXA and 16 parts by weight of methylhexahydrophthalic anhydride (abbreviation A1) were mixed at a molar ratio of 1:1.105. 0.05 parts by weight of triethanolamine to serve as a catalyst, was added to the mixture, which was then reacted in an oil bath at 120° C. for 30 minutes. Thereafter, 90 parts by weight of a liquid of 3,4-epoxycyclohexanemethyl-3,4-epoxy-cyclohexane carboxylate (abbreviation CE, cycloaliphatic epoxy resin commercially available from MITSUI SEKKA) was added into the oil bath to be reacted at 120° C. for a further 90 minutes. As such, the OXA-A1-CE resin was obtained. The viscosity at room temperature of the OXA-A1-CE resin was about 50 Pa·s, which was measured by a viscometer (BROOKFIELD DV-III ULTRA).

Preparation of Resin Composition

Example I 4 g of OXA-A1-HY, 6 g of OXA-A3-HY, 0.1 g of Aerosil® R974 (Fumed silica), and 0.6 g of UV cationic initiator (Chivacure®1176) were mixed at room temperature, and then diluted with propylene glycol mono-methyl ether acetate to have a viscosity of 1,000 cps. The dilution was milled by a three roll miller, defoamed by a defoamer, coated on different flexible substrates (PET, PEN, and PI) by a blade, and baked in an oven to remove the solvent, thereby obtaining a film of the resin composition with a thickness of about 25 μm. The substrate with a resin composition film coated thereon was cut to a size of 5 cm×5 cm, and then exposed by a UV light with a wavelength 365 nm and energy of 1500 mJ/cm$^2$ from a mercury lamp. The tackiness of the exposed film was measured. The substrate with the resin composition film coated thereon and another flexible substrate were pressed by a pressing machine (e.g. PET versus PET, PET versus PEN, and PI versus PI) to form a sample. The pressed sample was exposed by a UV light with a wavelength 365 nm and energy of 1500 mJ/cm$^2$ from a mercury lamp, and then baked in an oven at 80° C. for 30 minutes to cure the resin composition film between the flexible substrates. The sample was then cut to a strip of 2.5 cm×8 cm, and then tested with a testing standard (ASTM 1876-01 T-Peel Test) by a double-column tension device (QC Tech) with a tensile rate of 254 mm/min to measure its peel strength.

Example II 5 g of OXA-A1-HY, 5 g of OXA-B1-HY, 0.1 g of Aerosil® R974 (Fumed silica), and 0.2 g of thermal cationic initiator SI-80 (commercially available from Sanshin Chemical Industry Co., Ltd.) were mixed at room temperature, and then diluted with propylene glycol mono-methyl ether acetate to have a viscosity of 1,000 cps. The dilution was milled by a three roll miller, defoamed by a defoamer, coated on different flexible substrates (PET, PEN, and PI) by a blade, and baked in an oven to remove the solvent, thereby obtaining a film of the resin composition with a thickness of about 25 μm. The substrate with the resin composition film coated thereon and another flexible substrate were pressed by a pressing machine (e.g. PET versus PET, PET versus PEN, PI versus PI, and PEN versus PEN) to form a sample. The pressed sample was baked in an oven at 150° C. for 60 minutes to cure the resin composition film between the flexible substrates. The sample was then cut to a strip of 2.5 cm×8 cm, and then tested with a testing standard (ASTM 1876-01 T-Peel Test) by a double-column tension device (QC Tech) with a tensile rate of 254 mm/min to measure its peel strength.

Example III

Example III was similar to Example I, and the difference in Example III was the mixture being replaced by 5 g of OXA-A2-HY, 4 g of OXA-A1-EP, 1 g of OXA-A2-EP, 0.1 g of Aerosil® R974 (Fumed Silica), and 0.6 g of UV cationic initiator Chivacure®1176. The other processes and testing method are similar to that in Example I.

Example IV

Example IV was similar to Example I, and the difference in Example IV was the mixture being replaced by 7 g of OXA-A3-HY, 3 g of OXA-A2-EP, 0.1 g of Aerosil® R974 (Fumed Silica), and 0.6 g of UV cationic initiator Chivacure®1176. The other processes and testing method are similar to that in Example I.

Example V

Example V was similar to Example I, and the difference in Example V was the mixture being replaced by 4 g of OXA-A2-HY, 6 g of OXA-A1-CE, 0.1 g of Aerosil® R974 (Fumed Silica), and 0.6 g of UV cationic initiator Chivacure®1176. The other processes and testing method are similar to that in Example I.

Example VI

Example VI was similar to Example II, and the difference in Example VI was the mixture being replaced by 3 g of OXA-A2-EP, 7 g of OXA-A1-CE, 0.1 g of Aerosil® R974 (Fumed Silica), and 0.2 g of thermal cationic initiator SI-80. The other processes and testing method are similar to that in Example II.

Example VII

Example VII was similar to Example I, and the difference in Example VII was the mixture being replaced by 5 g of OXA-B1-HY, 5 g of OXA-A1-CE, 0.2 g of Aerosil® R974 (Fumed Silica), and 0.6 g of UV cationic initiator Chivacure®1176. The other processes and testing method are similar to that in Example I.

Comparative Example I 1 g of OXA, 4 g of HY, 5 g of CE, 0.1 g of Aerosil® R974 (Fumed silica), and 0.6 g of UV cationic initiator (Chivacure®1176) were mixed at room temperature, and then diluted with propylene glycol mono-methyl ether acetate to have a viscosity of 1,000 cps. The dilution was milled by a three roll miller, defoamed by a defoamer, coated on different flexible substrates (PET, PEN, and PI) by a blade, and baked in an oven to remove the solvent, thereby obtaining a film of the resin composition with a thickness of about 25 μm. The substrate with a resin composition film coated thereon was cut to a size of 5 cm×5 cm, and then exposed by a UV light with a wavelength 365 nm and energy of 1500 mJ/cm$^2$ from a mercury lamp. The tackiness of the exposed film was measured. The substrate with the resin composition film coated thereon and another flexible substrate were pressed by a pressing machine (e.g. PET versus PET, PET versus PEN, and PI versus PI) to form a sample. The pressed sample was exposed by a UV light with a wavelength 365 nm and energy of 1500 mJ/cm$^2$ from a mercury lamp, and then baked in an oven at 80° C. for 30 minutes to cure the resin composition film between the flexible substrates. The sample was then cut to a strip of 2.5 cm×8 cm, and then tested with a testing standard (ASTM 1876-01 T-Peel Test) by a double-column tension device (QC Tech) with a tensile rate of 254 mm/min to measure its peel strength.

Comparative Example II

Comparative Example II was similar to Comparative Example I, and the difference in Comparative Example II was the mixture being replaced by 7 g of HY, 3 g of EP, 0.1 g of Aerosil® R974 (Fumed Silica), and 0.6 g of UV cationic initiator Chivacure®1176. The other processes and testing method are similar to that in Comparative Example I.

Comparative Example III

Comparative Example III was similar to Comparative Example I, and the difference in Comparative Example III was the mixture being replaced by 5 g of HY, 5 g of EP, 0.2 g of Aerosil® R974 (Fumed Silica), and 0.6 g of UV cationic initiator Chivacure®1176. The other processes and testing method are similar to that in Comparative Example I.

Comparative Example IV 5 g of EP, 5 g of CE, 0.1 g of Aerosil® R974 (Fumed silica), and 0.2 g of thermal cationic initiator (SI-80) were mixed at room temperature, and then diluted with propylene glycol mono-methyl ether acetate to have a viscosity of 1,000 cps. The dilution was milled by a three roll miller, defoamed by a defoamer, coated on different flexible substrates (PET, PEN, and PI) by a blade, and baked in an oven to remove the solvent, thereby obtaining a film of the resin composition with a thickness of about 25 μm. The substrate with the resin composition film coated thereon and another flexible substrate were pressed by a pressing machine (e.g. PET versus PET, PET versus PEN, PI versus PI, and PEN versus PEN) to form a sample. The pressed sample was baked in an oven at 150° C. for 60 minutes to cure the resin composition film between the flexible substrates. The sample was then cut to a strip of 2.5 cm×8 cm, and then tested with a testing standard (ASTM 1876-01 T-Peel Test) by a double-column tension device (QC Tech) with a tensile rate of 254 mm/min to measure its peel strength.

The resin composition and film properties of Examples I to VII and Comparative Examples I to IV are listed in Table 1.

TABLE 1

| | Example I | Example II | Example III | Example IV | Example V | Example VI | Example VII | Comparative Example I | Comparative Example II | Comparative Example III | Comparative Example IV |
|---|---|---|---|---|---|---|---|---|---|---|---|
| OXA | | | | | | | | 10 | | | |
| HY (%) | | | | | | | | 40 | 70 | 50 | |
| OXA-A1-HY (%) | 40 | 50 | | | | | | | | | |
| OXA-A2-HY (%) | | | 50 | | 40 | | | | | | |
| OXA-A3-HY (%) | 60 | | | 70 | | | | | | | |
| OXA-B1-HY (%) | | 50 | | | | | 50 | | | | |
| EP (%) | | | | | | | | | 30 | 50 | 50 |
| OXA-A1-EP (%) | | | 40 | | | | | | | | |
| OXA-A2-EP (%) | | | 10 | 30 | | 30 | | | | | |
| CE (%) | | | | | | | | 50 | | | 50 |
| OXA-A1-CE (%) | | | | | 60 | 70 | 50 | | | | |
| Fumed silica (phr) | 1 | 1 | 1 | 1 | 1 | 1 | 1 | 1 | 1 | 1 | 1 |
| UV cationic initiator (phr) | 6 | | 6 | 6 | 6 | | 6 | 6 | 6 | 6 | |
| Thermal cationic initiator | | 2 | | | | 2 | | | | | 2 |
| Tackiness after exposed to UV | none | | none | none | none | | none | none | none | none | |
| Peel strength of PET vs. PET (kgf) | 4.0 | 3.4 | 3.1 | 3.8 | 3.2 | 3.3 | 3.2 | 0.5 | 0.9 | 0.6 | 0.4 |
| Peel strength of PET vs. PET (kgf) | 3.1 | 2.7 | 2.4 | 2.8 | 2.4 | 2.5 | 2.2 | 0.4 | 0.8 | 0.6 | 0.5 |
| Peel strength of PI vs. PI (kgf) | 1.9 | 1.3 | 1.2 | 1.5 | 1.3 | 1.3 | 1.2 | 0.03 | 0.07 | 0.08 | 0.04 |
| Peel strength of PEN vs. PEN (kgf) | | 2.2 | | | | 2.6 | | | | | 0.5 |

As shown in Table 1, the resin composition including the resin containing oxetane and epoxy groups might obviously enhance its adherence to the flexible substrates. For example, the peel strength of PET versus PET was improved at least 5 times, the peel strength of PET versus PEN was improved at least 4 times, the peel strength of PI versus PI was improved at least 25 times, and the peel strength of PET versus PEN was improved at least 4 times. Accordingly, the resin composition including the resin containing oxetane and epoxy groups had excellent adherence to the flexible substrates, especially polyimide (PI), polyethylene terephthalate (PET), polyethylene naphthalate (PEN), and the like.

It will be apparent to those skilled in the art that various modifications and variations can be made to the disclosed methods and materials. It is intended that the specification and examples be considered as exemplary only, with a true scope of the disclosure being indicated by the following claims and their equivalents.

What is claimed is:

1. A resin composition, comprising:
   100 parts by weight of a resin; and
   1 to 10 parts by weight of a curing agent, wherein the curing agent comprises a UV cationic initiator, thermal cationic initiator, or thermal anionic initiator,
   wherein the resin is formed by reacting:
   (a) a product of reacting 1 part by mole of a mono-oxetane with a hydroxyl group and 1.1 to 2.5 parts by mole of anhydride, and
   (b) 2.1 to 4.2 parts by mole of a diepoxy compound.

2. The resin composition as claimed in claim 1, wherein the diepoxy compound is

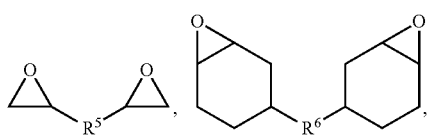

or a combination thereof;
wherein $R^5$ is

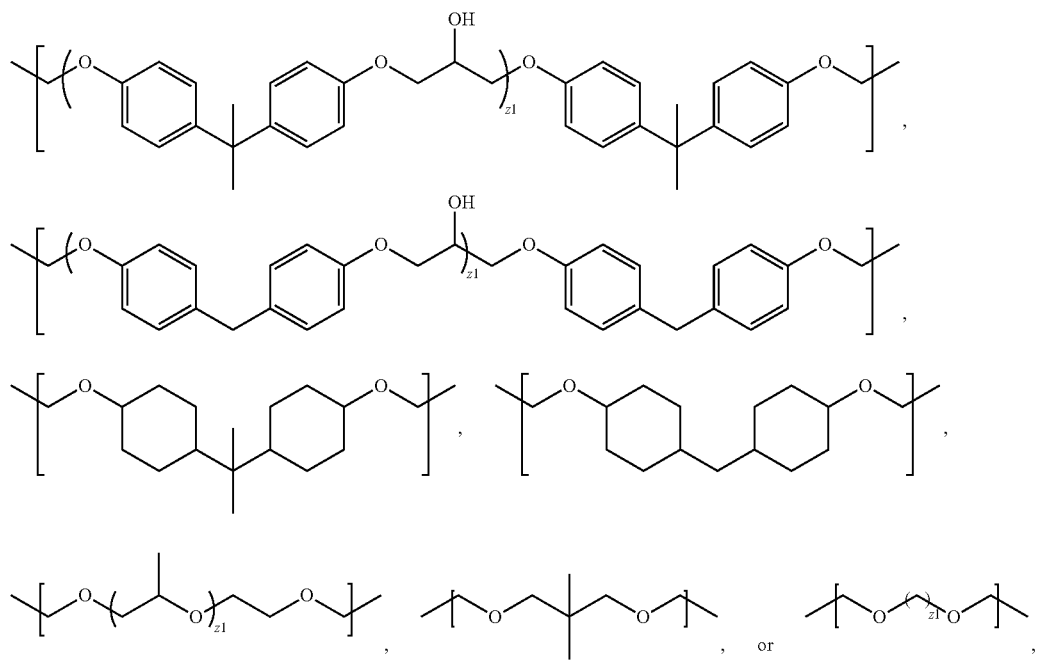

wherein z1 is an integer of 0 to 3;
$R^6$ is

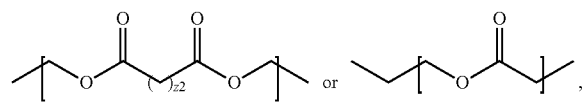

wherein z2 is a positive integer of 1 to 4.

3. The resin composition as claimed in claim 1, wherein the resin has a viscosity of 50 Pa·s to 1,100 Pa·s at room temperature.

4. The resin composition as claimed in claim 1, further comprising 0.1 to 30 parts by weight of an additive.

5. The resin composition as claimed in claim 4, wherein the additive comprises filler, defoamer, leveling agent, or a combination thereof.

6. The resin composition as claimed in claim 1, wherein the mono-oxetane with a hydroxyl group has a structure:

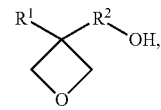

wherein $R^1$ is H, $C_{1-6}$ alkyl group, $C_{1-6}$ fluoroalkyl group, alkenyl group, or phenyl group,
and
$R^2$ is C1-6 alkylene group or vinyl ether group.

7. The resin composition as claimed in claim 1, wherein the mono-oxetane with a hydroxyl group has a structure:

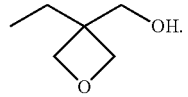

8. The resin composition as claimed in claim 1, wherein the anhydride has a structure:

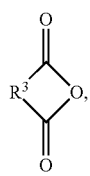

wherein R³ is

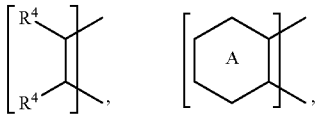

or a combination thereof,
each R⁴ is independently of H, $C_{1-16}$ alkyl group, or $C_{1-16}$ alkyl group where a —$CH_2$ group is substituted by oxygen, ethylene group, carbonyl group, carboxyl group, cyclohexyl group, or phenyl group;
wherein

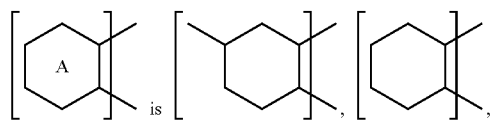

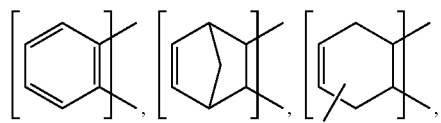

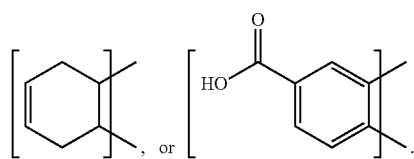

9. The resin composition as claimed in claim 1, wherein the anhydride has a structure:

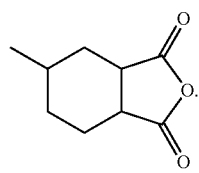

10. The resin composition as claimed in claim 1, wherein the diepoxy compound is

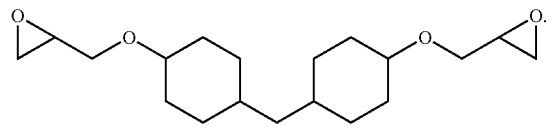 [SMILES: C1CC(OCC2CO2)CCC1CC1CCC(OCC2CO2)CC1]

11. The resin composition as claimed in claim 1, being:

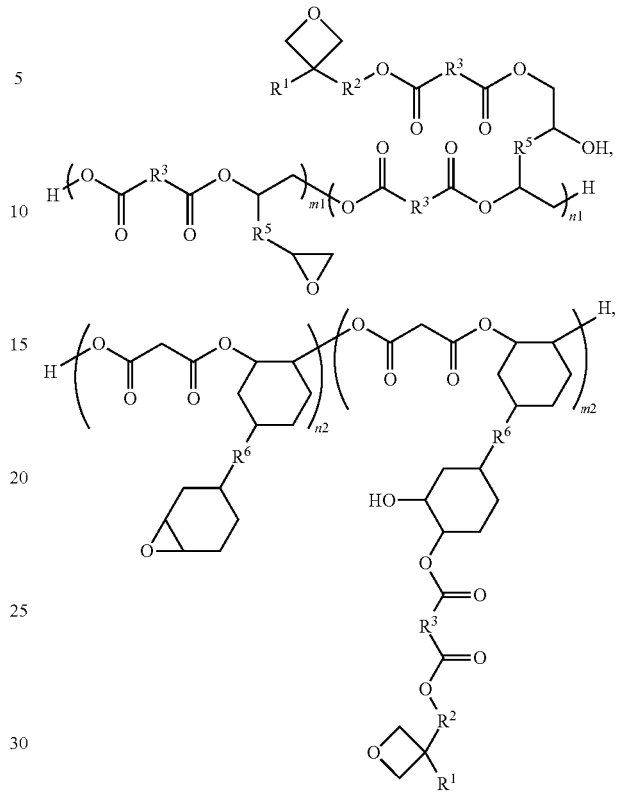

or a combination thereof,
wherein R¹ is H, $C_{1-6}$ alkyl group, $C_{1-6}$ fluoroalkyl group, alkenyl group, or phenyl group;
R² is $C_{1-6}$ alkylene group or vinyl ether group;
R³ is

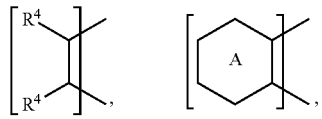

or a combination thereof,
each R⁴ is independently of H, $C_{1-16}$ alkyl group, or $C_{1-16}$ alkyl group where a —$CH_2$ group is substituted by oxygen, ethylene group, carbonyl group, carboxyl group, cyclohexyl group, or phenyl group;

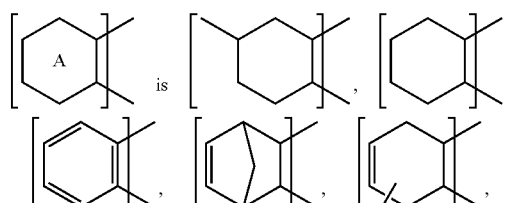

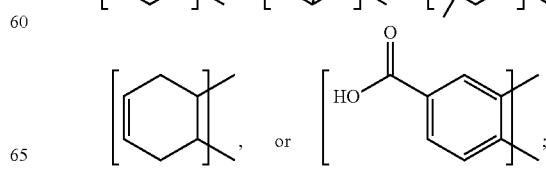

$R^5$ is
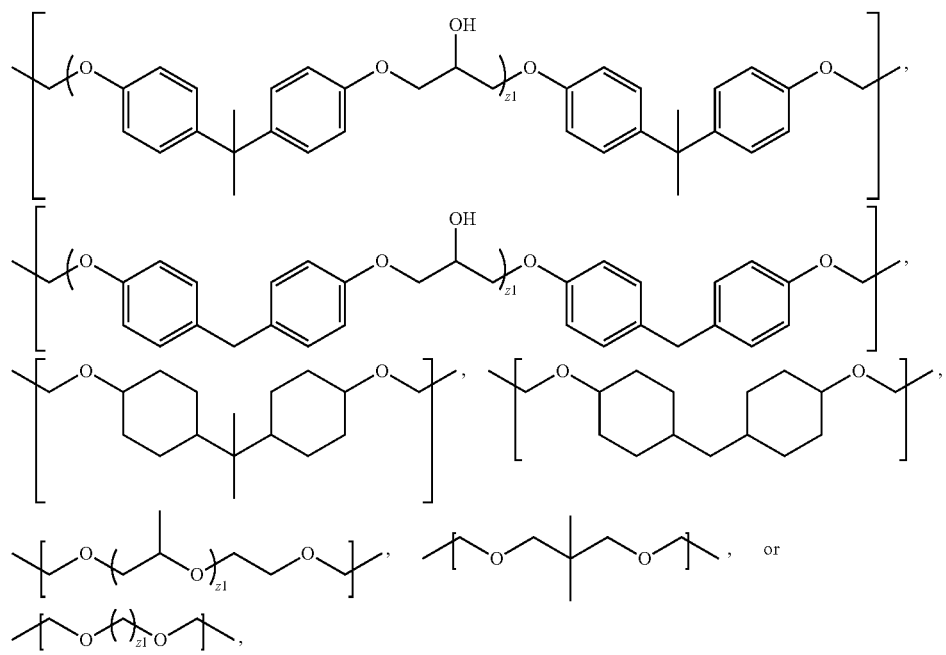
$R^6$ is
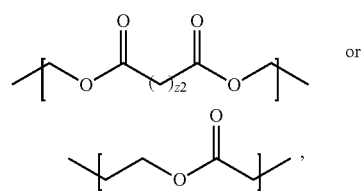
wherein z1 is an integer of 0 to 3, z2 is a positive integer of 1 to 4, m1 is a positive integer greater than 1, n1 is a positive integer greater than 1, m2 is a positive integer greater than 1, and n2 is a positive integer greater than 1.
* * * * *